(12) United States Patent
Wang et al.

(10) Patent No.: US 7,427,813 B1
(45) Date of Patent: Sep. 23, 2008

(54) STRUCTURE, MATERIAL, AND DESIGN FOR ASSEMBLING A LOW-K SI DIE TO ACHIEVE AN INDUSTRIAL GRADE RELIABILITY WIRE BONDING PACKAGE

(75) Inventors: Wen-chou Vincent Wang, Cupertino, CA (US); Yuan Li, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 318 days.

(21) Appl. No.: 10/719,218

(22) Filed: Nov. 20, 2003

(51) Int. Cl.
*H01L 29/40* (2006.01)
*H01L 23/28* (2006.01)
*H01L 23/29* (2006.01)

(52) U.S. Cl. .............. 257/790; 257/643; 257/787; 257/656; 257/727; 257/734

(58) Field of Classification Search ........... 257/790, 257/643, 787, 666, 727, 734, 778, 656
See application file for complete search history.

(56) References Cited

U.S. PATENT DOCUMENTS

| | | | | |
|---|---|---|---|---|
| 5,317,195 A * | 5/1994 | Ishikawa et al. | ........... | 257/787 |
| 5,536,584 A * | 7/1996 | Sotokawa et al. | ........... | 428/458 |
| 5,536,970 A * | 7/1996 | Higashi et al. | ............. | 257/676 |
| 5,561,329 A * | 10/1996 | Mine et al. | ............. | 257/788 |
| 5,729,050 A * | 3/1998 | Kim | ............. | 257/667 |
| 5,888,849 A * | 3/1999 | Johnson | ............. | 438/126 |
| 6,087,006 A * | 7/2000 | Tanaka et al. | ............. | 428/411.1 |
| 6,528,722 B2 * | 3/2003 | Huang et al. | ............. | 174/52.2 |
| 6,602,803 B2 * | 8/2003 | Yew et al. | ............. | 438/780 |
| 6,709,895 B1 * | 3/2004 | Distefano | ............. | 438/115 |
| 6,818,968 B1 * | 11/2004 | Cheah | ............. | 257/666 |
| 2002/0130397 A1 * | 9/2002 | Yew et al. | ............. | 257/666 |
| 2004/0155358 A1 * | 8/2004 | Iijima | ............. | 257/778 |

\* cited by examiner

*Primary Examiner*—Howard Weiss
*Assistant Examiner*—Steven H Rao
(74) *Attorney, Agent, or Firm*—Weaver Austin Willeneuve & Sampson LLP

(57) ABSTRACT

Provided are semiconductor low-K Si die wire bonding packages with package stress control and fabrication methods for such packages. The packages include molding interface material applied onto the low-K Si die. In general, the molding interface material is selectively applied onto the low-K Si die surface in order to minimize to safe levels the package stress experienced by the low-K Si die. Selective application includes defining various combinatorial patterns of coated and non-coated regions. In addition, selective application may also include a general application of molding interface material to create a stress buffer zone. The results are packages with less stress experienced by the low-K Si die and so improved reliability (in compliance with industry specifications).

20 Claims, 8 Drawing Sheets

STRUCTURE, MATERIAL, AND DESIGN FOR ASSEMBLING A LOW-K SI DIE TO ACHIEVE AN INDUSTRIAL GRADE RELIABILITY WIRE BONDING PACKAGE

BACKGROUND OF THE INVENTION

This invention relates generally to semiconductor chip package assembly, and in particular to wire bonding package assembly. More specifically, the invention relates to lead frame packages having low-K Si dice applied with molding interface materials and corresponding methods for their assembly.

As advances in semiconductor technology increase the speeds of integrated chips (dice), a shift towards using dice with a plurality of layers of low dielectric constant (low-K) materials have been sought. Such low-K materials assist in the reduction of propagation delay, thereby improving the electrical performance of low-K Si dice. However, low-K Si dice have also presented significant packaging problems for incorporation in conventional wire bonding packages.

One such problem is that during the manufacture, industrial grade reliability testing (e.g., as provided by Electronic Industries Association—EIA or Joint Electron Device Engineering Council—JEDEC), or field use of these low-K Si dice in conventional wire bonding packages, the low-K Si dice may experience substantial amounts of damaging mechanical stress (e.g., tensile stress; shear stress) resulting from the construction of the packages themselves. This is because depending on the amounts of temperature cycling that the packages experience and the differences in the coefficient of the thermal expansion (CTE) of the various package components (e.g., molding compound, wire bonding packaging substrate, low-K Si die, etc.), the resulting mechanical stress (herein referred to as "package stress") generated within the package may be large enough to crack, delaminate, or collapse any layer of the low-K materials in the dice. For example, cracks will initiate in the low-K material layers during reliability thermal cycle testing and especially during industrial grade testing that ranges from −55° C. to 125° C. As such, the reliability and operability of these low-K Si dice can be substantially compromised and impaired. Furthermore, since low-K materials are structurally brittle, their susceptibility to the damaging effects of these stresses is even greater than other dielectric materials (e.g., silicon dioxide).

In controlling these package stresses, many factors must be considered. Of particular significance, however, is the interplay between the low-K Si die and the molding material (i.e., molding compound) used to form the molding cap of the wire bonding package. Since the molding compound is used to couple together the various components (e.g., electrical contacts, substrate, die attach pad, die, etc.) of the wire bonding package, the molding compound plays a significant part in transferring the stress from other parts of the wire bonding package (as well as from itself) to the low-K Si die and vice versa. In order to minimize the amount of stress transferred, one approach is to use a molding compound having a low modulus and low CTE that is closer to that of the low-K Si die.

Although the described approach may provide satisfactory results in some cases, there are continuing efforts to provide further improved low-K Si die wire bonding packages and packaging methods that control the package stresses induced onto the low-K Si die and that provide industrial grade reliability thereof for incorporating into electronic devices.

SUMMARY OF THE INVENTION

To achieve the foregoing, the present invention provides a low-K Si die wire bonding package with package stress control and industrial grade reliability (e.g., passing thermal cycling condition B (−55° C. to 125° C.); JESD22-A104; Mil Std 1010). The present invention also provides fabrication methods for such packages. The packages of the present invention include dice covered with molding interface materials that can control the considerable pressures caused by the CTE mismatch between the various components in the packages.

In one aspect, a semiconductor package includes a die that has a plurality of layers of low-K dielectric material. The die also has a top surface, a bottom surface, and a plurality of side surfaces where each surface has associated corner and edge regions. The semiconductor package also includes a wire bonding packaging substrate having a plurality of electrical contacts where the packaging substrate is positioned under the die; a plurality of interconnects electrically connecting the die to the plurality of electrical contacts; a molding interface material applied to at least a portion of the die where the molding interface material is configured to control at least one of tensile and shear stresses experienced by the die; and a molding cap covering at least a portion of the die, packaging substrate, interconnects, and molding interface material. The layers of low-K dielectric material may include extra low-K dielectric material.

In one embodiment, the molding interface material controls by applying compressive stress to the die, thereby strengthening the die against the at least one of tensile and shear stresses.

In another embodiment, the molding interface material is polyimide. Generally, the molding interface material is on at least a portion of the plurality of side surfaces of the die. The molding interface material may also be on a corresponding adjacent portion of the packaging substrate such that the die is firmly attached to the packaging substrate.

In another embodiment, the molding interface material is applied in multiple non-contiguous regions to the top surface of the die. At least one of the multiple non-contiguous regions is rectangular in shape or triangular in shape. Each of the multiple non-contiguous regions has a thickness of less than 2 microns.

Further, in another embodiment, the molding interface material is a contiguous region on the top surface of the die excluding corner regions. The contiguous region is offset from the corner regions by about 100 to 150 microns. Alternatively, the molding interface material is a contiguous region on the top surface of the die excluding edge regions. The contiguous region is offset from the edge regions by about 100 to 150 microns.

Yet in another embodiment, the molding interface material has a coefficient of thermal expansion between 5 ppm and 40 ppm. In addition, the molding interface material is over a substantial portion of the die such that a stress buffer zone is established between the die and the molding cap.

In another aspect, a method of forming a semiconductor package includes: (1) providing a die with a layer of low-K dielectric material, the die having a top surface, a bottom surface, and a plurality of side surfaces, each surface having associated corner and edge regions; (2) applying a molding interface material to at least a portion of the die, the molding interface material being configured to control at least one of tensile and shear stresses experienced by the die; (3) coupling the bottom surface of die with a packaging substrate, the packaging substrate having a plurality of electrical contacts; (4) connecting a plurality of interconnects between the die and the plurality of electrical contacts; and (5) forming a molding cap that covers at least a portion of the die, packaging substrate, interconnects, and molding interface material.

In one embodiment, the method of forming a semiconductor package further includes (6) cycling the temperature of the semiconductor package from −55° C. to 125° C. to create internal stress within the semiconductor package, wherein the die is stably integrated within the semiconductor package such that the reliability of the die is not substantially impaired by the internal stress of the semiconductor package.

In another aspect, a method of forming a semiconductor package includes: (1) applying a first molding interface material to a front surface of a semiconductor wafer; (2) singulating the wafer to form a die, the die having a layer of low-K dielectric material, a top surface that corresponds to the front surface of the semiconductor wafer, a bottom surface, and a plurality of side surfaces, each surface having associated corner and edge regions; (3) coupling the bottom surface of the die with a packaging substrate, the packaging substrate having a plurality of electrical contacts; (4) connecting a plurality of interconnects between the at least one die and the plurality of electrical contacts; and (5) forming a molding cap that covers at least a portion of the at least one die, packaging substrate, interconnects, and molding interface material.

In one embodiment, the method of forming a semiconductor package further includes (6) applying a second molding interface material to any of the surfaces of the die. The first and second molding interface materials are configured to control at least one of tensile and shear stresses experienced by the die.

These and other features and advantages of the invention will be presented in more detail below with reference to the associated drawings.

DETAILED DESCRIPTION OF SPECIFIC EMBODIMENTS

Figure 1A:
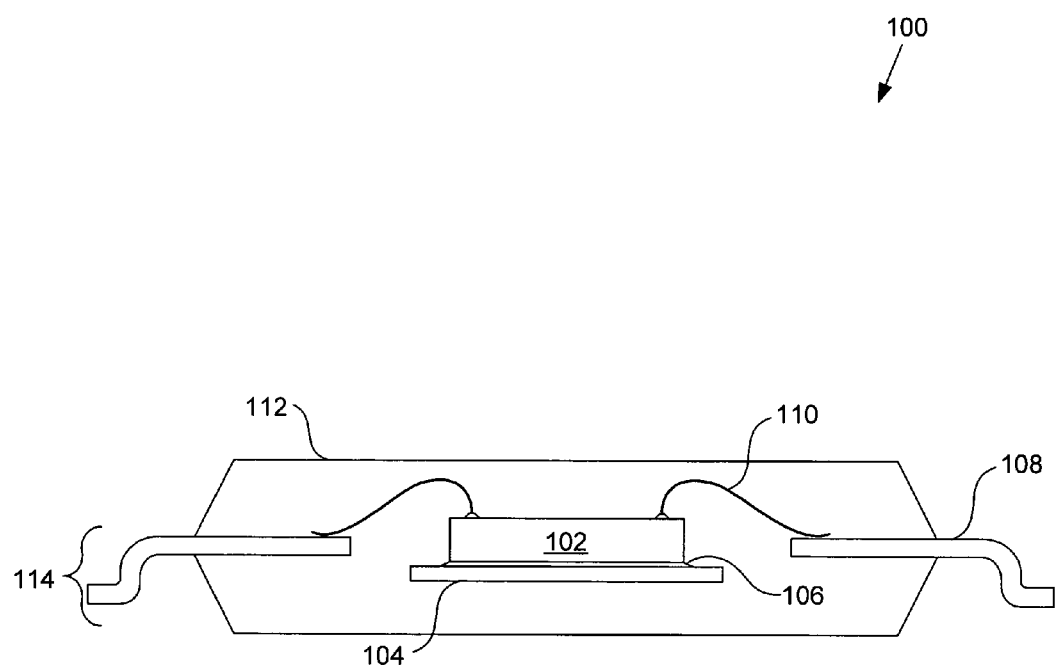
FIG. 1A illustrates a cross-sectional view of a lead frame type wire bonding package according to various embodiments of the present invention.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

When used in combination with "comprising," "a method comprising," "a device comprising" or similar language in this specification and the appended claims, the singular forms "a," "an," and "the" include plural reference unless the context clearly dictates otherwise. Unless defined otherwise, all technical and scientific terms used herein have the same meaning as commonly understood to one of ordinary skill in the art to which this invention belongs.

The present invention provides a low-K Si die wire bonding package with stress control and industrial grade reliability (e.g., complying with industry specifications such as EIA, JEDEC, etc.). The present invention also provides fabrication methods for such packages. Conventional wire bonding package constructions are inadequate to effectively control the package stresses being transferred to the low-K material within a low-K Si die. In other words, conventional wire bonding package constructions are inadequate to protect the low-K material (as well as the die itself) from the package stresses. The packages of the present invention include a molding interface material that is applied between the low-K Si die and the molding compound such that the molding interface material strengthens the structural integrity of the low-K Si die and/or the molding interface material redistributes the packaging stress caused by the CTE mismatch between the various components of the wire bonding package (e.g., molding compound, substrate, silicon portion of the die, low-K dielectric portion of the die, die attach pad, etc.). As such, the present invention allows sufficient flexibility and support to counter the inherent package stresses of the CTE mismatch (e.g., caused from temperature cycling during reliability thermal cycle testing and during industrial grade testing that ranges from −55° C. to 125° C.) without causing any layer of the low-K materials to delaminate or crack.

Moreover, the present invention provides for enhanced low-K Si die and package reliabilities, particularly for large die sizes, that complies with industry reliability testing standards (e.g., passing thermal cycling condition B (−55° C. to 125° C.); JESD22-A104; Mil Std 1010). For example, the present invention can allow for the low-K Si die to be stably integrated within the package such that the reliability of the low-K Si die is not substantially impaired (e.g., die being able to continue to perform reliably and function effectively; the low-K Si die and/or layers of low-K material not showing signs of damage such as cracking, chipping, delamination, or breaking) by internal stress of the package, which is caused by the CTE mismatches under temperature cycling conditions (e.g., during manufacture, industrial grade reliability testing, or use in the field). The advantages of the present invention will further be evident in cases where the low-K material is substituted by extra low-K material, such as for an extra low-K Si die wire bonding package.

A typical low-K Si die includes a plurality of layers of low-K dielectric material, within the silicon (Si) based die (CTE of about 2.6 ppm), where the low-K dielectric material has a CTE between the range of 20 ppm and 50 ppm. In addition, the low-K dielectric material has a dielectric constant below that of silicon dioxide and ranges from about 2.6 to 3.5. In one embodiment, a plurality of layers of extra low-K (e.g., ultra low-K) material may be used in place of the low-K material. Extra low-K material typically has a CTE between the range of 10 ppm and 40 ppm along with a dielectric constant between 2.2 and 2.6.

Dimensionally, the low-K/extra low-K materials usually form a plurality of layers that has a thickness that is about $\frac{1}{100}$ (e.g. 5 microns) of the low-K Si die thickness (e.g., 200-500 microns). In a preferred embodiment, the thickness of the plurality of low-K/extra low-K layers is less than 6 microns. Overall, low-K Si die may have dimensions on the order of about 4-900 mm$^2$ and 8-20 mils thick. The present invention is particularly advantageous when applied to wire bonding packages having a large die size, for example, 100 mm$^2$ or larger (e.g., 10×10 mm, 13×16 mm, 14×17 mm, 20×20 mm, 20×23 mm, 22×22 mm, 23×28 mm, or 26×32 mm). This is because with larger amounts of heat, as is typically generated by larger dice, the larger the amounts of thermal and mechanical stress produced within the dice or wire bonding packages. Furthermore, as compared to smaller sized dice, larger sized dice have corresponding low-K dielectric layers with larger surface areas that can be more susceptible to larger amounts of mechanical stress per square area and/or more susceptible to the damaging effects of the package stresses.

In general, the plurality of layers can have any number of low-K or extra low-K materials including, but not limited to: aerogel, xerogel, NANOGLASS® (available from Honeywell, Morristown, N.J.), FLARE™ (available from Honeywell, Morristown, N.J.), SiLK™ (available from The Dow Chemical Company, Midland, Mich.), LKD® (available from JSR Micro, Sunnyvale, Calif.), CORAL® (available from Novellus Systems, Inc., San Jose, Calif.), and Black Diamond™ (available from Applied Materials, Inc., Santa Clara, Calif.). In a preferred embodiment, however, the low-K Si die includes Black Diamond™ having a CTE in the range of about 20-23 ppm. Alternatively, the low-K Si die may include SiLK™ having a CTE of about 50 ppm.

The present invention is generally applicable to different types of wire bonding packages. One type is shown in FIG. 1A, which illustrates a cross-sectional view of a lead frame type wire bonding package 100 according to various embodiments of the present invention. Generally, a lead frame substrate 114 includes a die attach pad 104 and corresponding electrical contacts 108 (i.e., leads) disposed about die attach pad 104. During assembly, a die 102 is attached to die attach pad 104 with an adhesive 106 (e.g., die attach epoxy) and conventional wire bonding (e.g., Gold interconnects 110) are used to electrically couple bond pads (not shown) on die 102 to electrical contacts 108. After the wire bonding, a molding cap 112 made out of molding compound is formed over at least a portion of die 102, die attach pad 104, adhesive 106, electrical contacts 108, and interconnects 110. Typically, molding cap 112 is formed with any number of molding compounds including, but not limited to: Nitto MP-8000 series (available from Nitto Denko Americas, Fremont, Calif.) and Sumitomo E730J (available from Sumitomo Corporation, Tokyo, Japan). The resulting lead frame type wire bonding package 100 with its exposed portions of electrical contacts 108 can then be surface mounted on a printed circuit board or other surface using conventional mounting techniques.

Figure 1B:
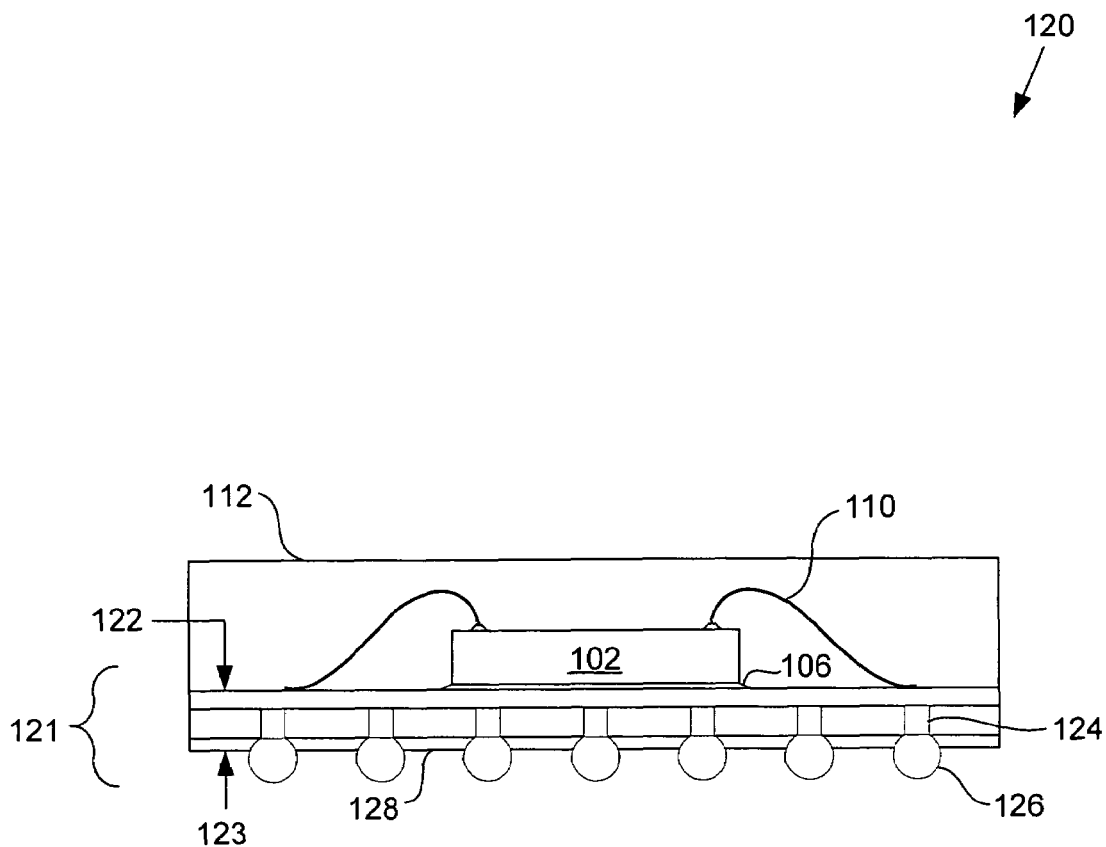
FIG. 1B illustrates a cross-sectional view of a ball grid array type wire bonding package according to various embodiments of the present invention.

Another type of wire bonding package is shown in FIG. 1B and illustrates a cross-sectional view of a ball grid array type wire bonding package 120 according to various embodiments of the present invention. Generally, a ball grid array substrate 121 includes an upper surface 122 having a die attach pad (not shown) and corresponding electrical contacts (not shown) disposed about the die attach pad. Also included is a layer of solder mask 128 forming a lower surface 123, which is opposite upper surface 122, with openings that define the location of solder balls 126. Solder balls 126 are electrically connected to the electrical contacts on the upper surface through punched/etch vias 124. During assembly, a die 102 is attached to the die attach pad with an adhesive 106 (e.g., die attach epoxy) and conventional wire bonding (e.g., interconnects 110) are used to electrically couple bond pads (not shown) on die 102 to the electrical contacts on substrate 121. After the wire bonding, molding cap 112 is formed over at least a portion of die 102, die attach pad, adhesive 106, electrical contacts, and interconnects 110. The resulting ball grid array type wire bonding package 120 with its exposed portions of solder balls 126 can then be surface mounted on a printed circuit board or other surface using conventional mounting techniques.

Figure 2:
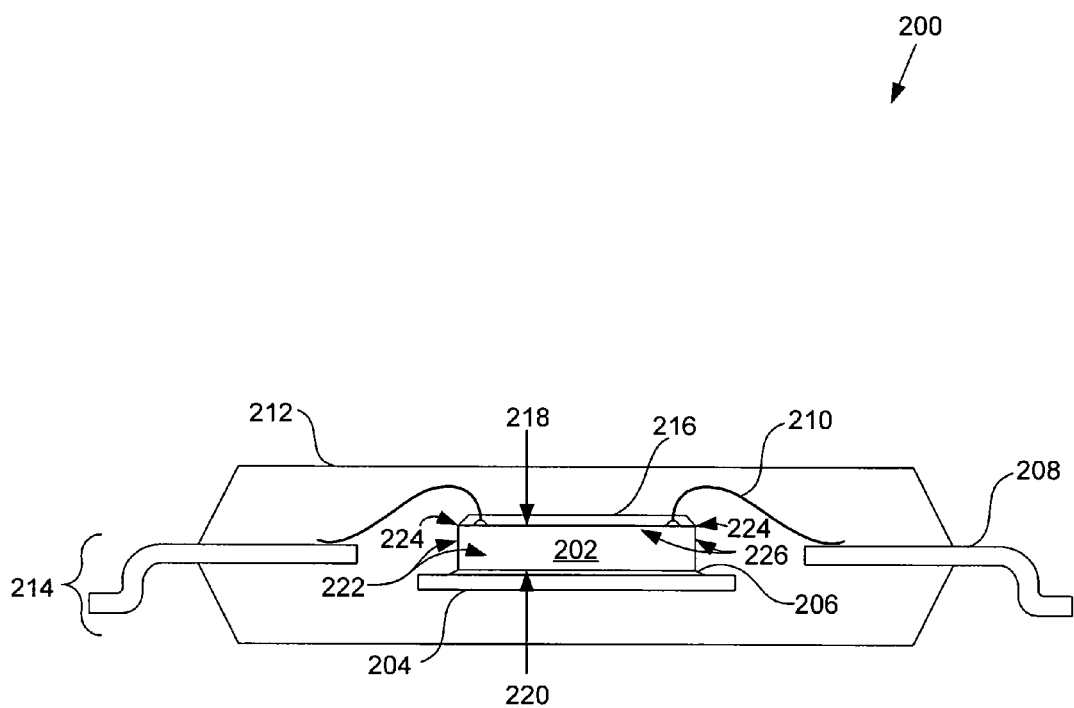
FIG. 2 illustrates a cross-sectional view of a low-K Si die lead frame type wire bonding package with an application of molding interface material to the top surface of the low-K Si die according to various embodiments of the present invention.

A variety of strategies are used in conjunction with the application of the molding interface material in accordance with the present invention. Specific embodiments of the present invention are illustrated and described with reference to FIG. 2. As shown, FIG. 2 illustrates a cross-sectional view of a low-K Si die lead frame type wire bonding package 200 with an application of molding interface material 216 to a top surface 218 of a low-K Si die 202 according to various embodiments of the present invention. Many of the package processes and package components used in package 100 may be used in package 200.

Referring to FIG. 2, low-K Si die 202 has a top surface 218, a bottom surface 220, and a plurality of side surfaces 222. Typically, each surface is shaped in a polygon (e.g., square, rectangle, etc.). Each surface also includes associated corner regions 224 and edge regions 226. For example, a four-sided rectangular top surface would have four corner regions 224 and four edge regions 226. As shown, a wire bonding packaging substrate 214 includes die attach pad 204 and a plurality of electrical contacts 208 disposed therewith. Die 202 is positioned over die attach pad 204 of the wire bonding packaging substrate. A plurality of interconnects 210 electrically connect die 202 to the plurality of electrical contacts 208. In this package configuration, molding interface material 216 is applied to at least a portion of die 202 where the molding interface material is configured to control at least one of tensile and shear stresses experienced by die 202. The application of molding interface material 216 may be applied before or after wire bonding interconnects 210. Finally, a molding cap 212 covers at least a portion of die 202, packaging substrate 214, interconnects 210, and molding interface material 216.

Molding interface material 216 is any suitable material that can be applied to any surface (e.g., top surface 218; bottom surface 220; side surfaces 222) of low-K Si die 202 so that the package stress experienced by low-K Si die 202 is minimized to safe levels (e.g., package stress amounts where layer of low-K material will not crack or delaminate). In one embodiment, molding interface material also provides adhesion between low-K Si die 202 and the molding compound of molding cap 212 such that low-K Si die 202 is stably integrated within molding cap 212. The adhesion is generally better than that provided by SiON. For example, polyimide (PI), epoxy, or BCB (available from The Dow Chemical Company, Midland, Mich.) may be used for molding interface material 216. In another embodiment, a soft, low CTE, and/or low glass transition temperature ($T_g$) polymer is used. Any number of coats (e.g., layers) of molding interface material 216 having any suitable thickness may be used. Generally, the thickness is less than about 5 microns. In a preferred embodiment, molding interface material 216 has a thickness of less than 2 microns. Further, the coats may define any pattern necessary to reduce the package stress experienced by low-K Si die 202.

However, molding interface material 216 may also contribute to the package stress. For instance, since PI exhibits volume shrinkage (about 30 to 50%) during curing and has a large CTE (approximately 20-70 ppm) relative to that of low-K Si die 202 (approximately 2.6 ppm), high amounts of tensile stress may be generated during the cool down from the curing temperature (approximately 350° C.) to the room temperature. Depending on how the PI is applied on low-K Si die 202, the high amounts of tensile stress generated may be sufficient to damage the layers of low-K material. On the other hand, PI may generate compressive stresses onto low-K Si die 202 such that the die is strengthened against the package stresses (e.g., at least one of tensile and shear stresses). This is because the compressive stress tends to grip or hold together the surface it is acting upon. Therefore, particularly for larger sized dice, molding interface material 216 must be selectively applied onto the surface of low-K Si die 202 in order to minimize to safe levels the package stress experienced by low-K Si die 202.

To elaborate on the selective application of molding interface material, reference will now be made to FIGS. 3A-3D where coats of molding interface material define various example patterns in accordance with the PI. FIGS. 3A-3D illustrates different patterns for the application of molding interface material that include coated areas 304 and non-coated areas 306. As the name implies, coated areas 304 are areas on the low-K Si die surface where molding interface material is applied. Similarly, non-coated areas 306 are areas on the low-K Si die surface where no molding interface material is applied. Typically, any number and shape of coated areas 304 and non-coated areas 306 may be sought to define any number of contiguous or noncontiguous regions on the underlying die surface (e.g., top surface 218) within the parameters described herein for controlling tensile and/or shear stresses experienced by the die. Further, the combination and relative position between coated areas 304 and non-coated areas 306 on the underlying die surface is selected based on any number of package stress controlling factors including, but not limited to: the size of the low-K Si die; the amount of compressive stress each coated area contributes to the package stress resistance (e.g., strengthening) of the low-K Si die; and/or the amount of tensile stress or shear stress each coated area contributes to the package stress being induced upon the low-K Si die. Generally, however, the package stress experienced by low-K Si die (e.g., from the center to edge/corner of a low-K material layer) can be reduced by controlling the thickness and dividing the areas where molding interface material (e.g., PI) is applied. This is because smaller regions (as opposed to one large region covering the same area as the smaller regions combined) of package stress onto low-K Si die are effectively produced.

Figure 3A:
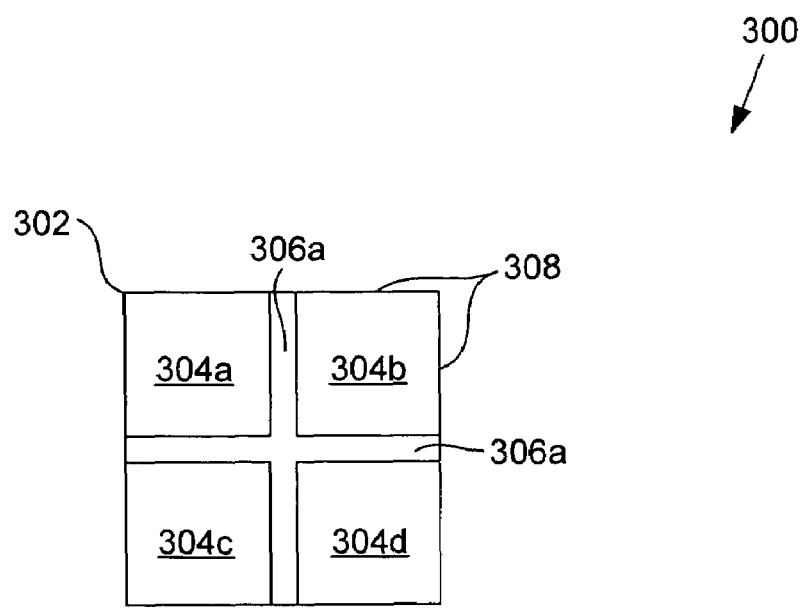
FIG. 3A illustrates a top view of a pattern defined by an application of molding interface material according to one embodiment of the present invention.

FIG. 3A illustrates a top view of a pattern 300 defined by an application of molding interface material according to one embodiment of the present invention. Pattern 300 includes four edge regions 308 and four corner regions 302, which may correspond to edge regions 226 and corner regions 224 of the underlying low-K Si die 202 surface which molding interface material 216 is applied upon. As shown, pattern 300 also includes four coated areas 304(a-d) where each coated area is shaped as a four-sided polygon (e.g., square) and positioned at a different corner region 302 (e.g., 224 of top surface 218). Coated areas 304(a-d) are further separated from each other by non-coated area 306a. Here, non-coated area 306a is shaped in the form of a cross.

Figure 3B:
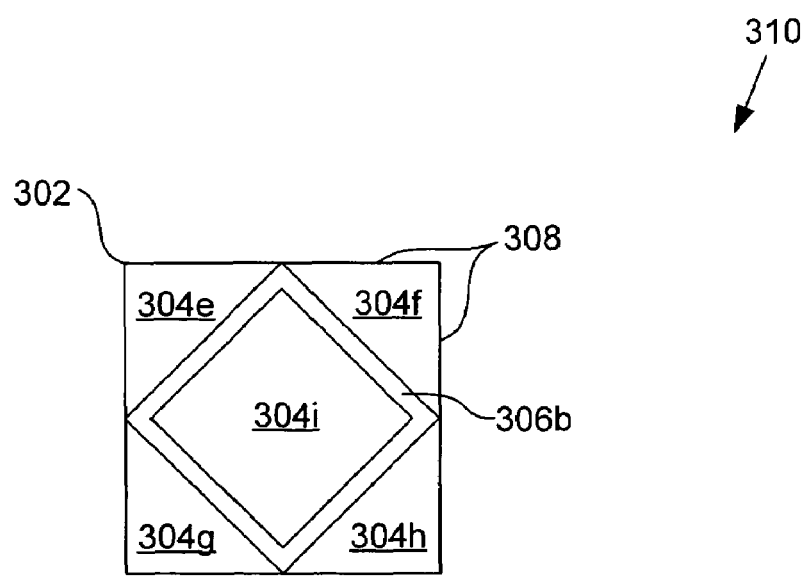
FIG. 3B illustrates a top view of a pattern defined by an application of molding interface material according to a second embodiment of the present invention.

FIG. 3B illustrates a top view of an alternative pattern 310 defined by an application of molding interface material according to a second embodiment of the present invention. Pattern 310 includes four edge regions 308 and four corner regions 302, which may correspond to edge regions 226 and corner regions 224 of the underlying low-K Si die 202 surface which molding interface material 216 is applied upon. As shown, pattern 300 also includes five coated areas 304(e-i). Coated areas 304(e-h) are each shaped as a triangle and positioned at a different corner region 302 (e.g., 224 of top surface 218). Coated area 304i is shaped as a four-sided polygon (e.g., square) and positioned about the center of pattern 310 where it is surrounded by coated areas 304(e-h). Coated areas 304(e-h) are further separated from coated area 304(i) by non-coated area 306b. Here, non-coated area 306b is shaped in the form of a hollow four-sided polygon (e.g., picture frame).

Figure 3C:
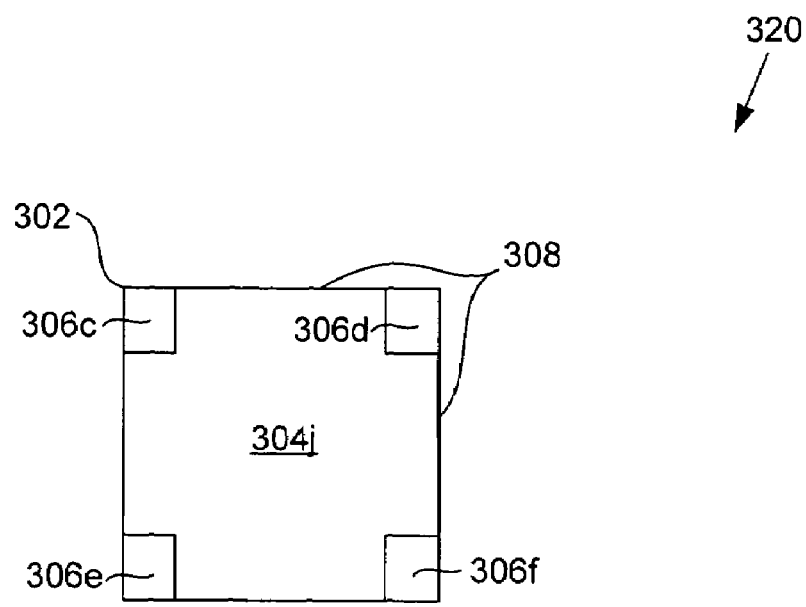
FIG. 3C illustrates a top view of a pattern defined by an application of molding interface material according to a third embodiment of the present invention.

In another example pattern, FIG. 3C illustrates a top view of a pattern 320 defined by an application of molding interface material according to a third embodiment of the present invention. Pattern 320 includes four edge regions 308 and four corner regions 302, which may correspond to edge regions 226 and corner regions 224 of the underlying low-K Si die 202 surface which molding interface material 216 is applied upon. As shown, pattern 320 also includes one coated area 304j. Coated area 304j is shaped as a cross, which is positioned about the center of pattern 320, and sized such that the four ends of the cross terminate individually along edge regions 308. Non-coated areas 306(c-f) are each shaped as a four-sided polygon (e.g., square) and position at a different corner region 302 (e.g., 224 of top surface 218). Non-coated areas 304(c-f) are further separated from each other by coated area 304j. That is, coated area 304j, which defines a contiguous region, is offset from corner regions 302 (e.g., 224). In a preferred embodiment, the offset is measured to be about 100-150 microns.

Figure 3D:
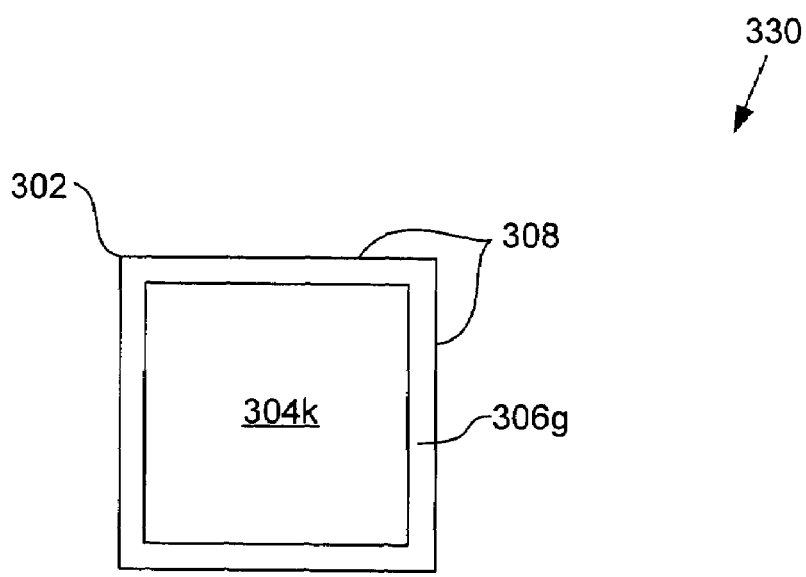
FIG. 3D illustrates a top view of a pattern defined by an application of molding interface material according to a forth embodiment of the present invention.

Lastly, FIG. 3D illustrates a top view of a pattern defined by an application of molding interface material according to a forth embodiment of the present invention. Pattern 330 includes four edge regions 308 and four corner regions 302, which may correspond to edge regions 226 and corner regions 224 of the underlying low-K Si die 202 surface which molding interface material 216 is applied upon. As shown, pattern 330 also includes one coated area 304k. Coated area 304k is shaped as a four-sided polygon (e.g., square), which is positioned about the center of pattern 330, and offset from the edge regions 308 by non-coated area 306g. Non-coated area 306g is shaped as a hollow four-sided polygon (e.g., picture frame) and positioned along the periphery of pattern 330. That is, coated area 304k, which defines a contiguous region, is offset from the edge regions 308 (e.g., 226). In a preferred embodiment, the offset is about 100-150 microns.

Offsetting coated areas 304 from the corner and/or edge regions confers the advantage of avoiding microscopic cracks often present on corner and/or edge regions after dice singulation. However, selective application of molding interface material to these regions may reduce the propagation of these cracks in low-K Si die. In another embodiment, coated areas 304 are offset from the bond pads (where interconnect is bonded to on low-K Si die). If offsetting is used, molding interface material will generally be offset from edges, corners, or bond pads at a distance more than 20 microns (e.g., 200 microns; 300 microns).

Figure 4A:
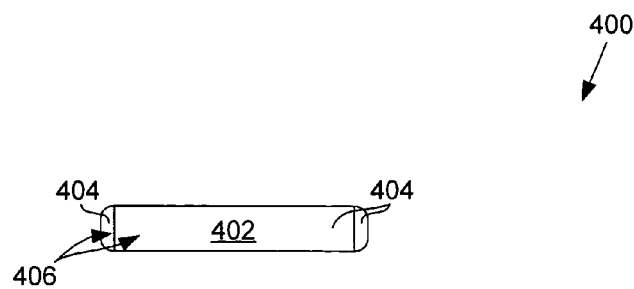
FIG. 4A illustrates a pre-mounted low-K Si die with an application of molding interface material to the side surfaces according to various embodiments of the present invention.
Figure 4B:
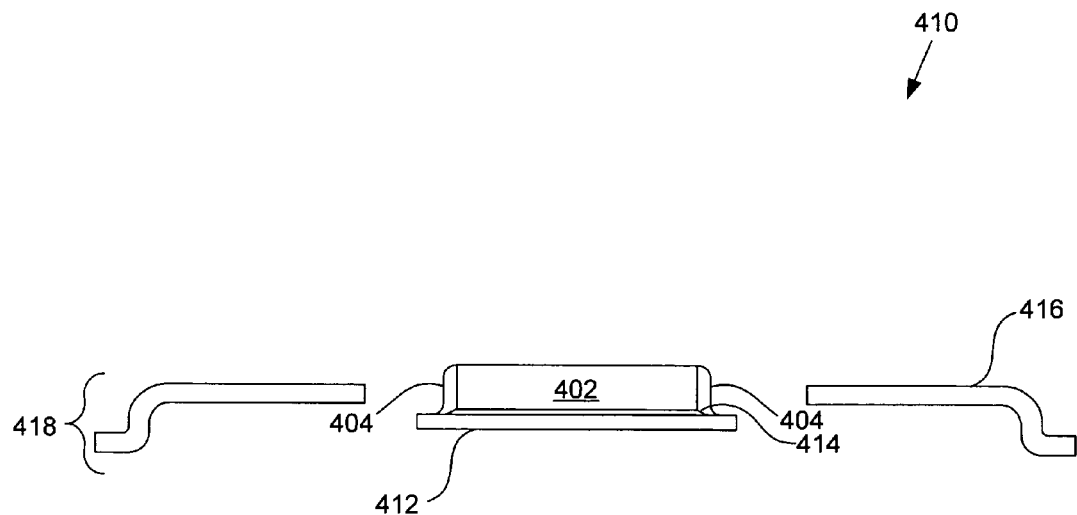
FIG. 4B illustrates a post-mounted low-K Si die with an application of molding interface material to the side surfaces according to various embodiments of the present invention.
Figure 5:
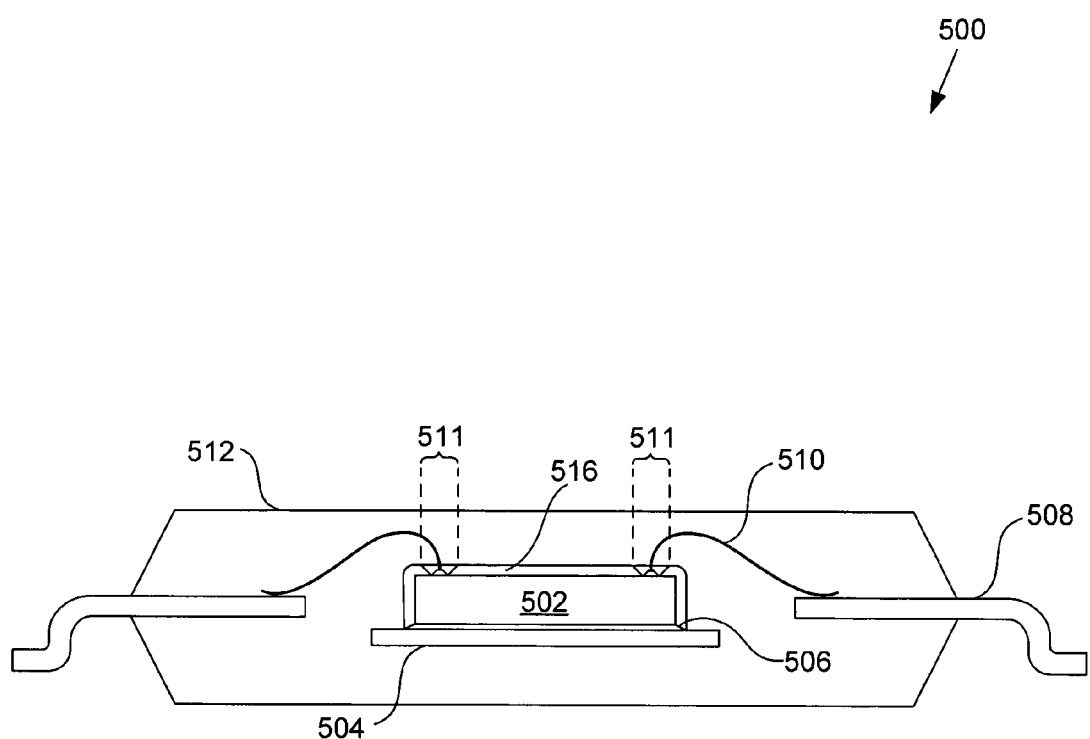
FIG. 5 illustrates a general application of a molding interface material to a low-K Si die lead frame type wire bonding package according to various embodiments of the present invention.

Other selective applications of molding interface material are illustrated in FIGS. 4A, 4B, and 5. First, FIG. 4A illustrates a pre-mounted low-K Si die 400 with an application of molding interface material 404 to side surfaces 406 of low-K Si die 402. The application of molding interface material 404 is done before low-K Si die 402 is mounted into its corresponding wire bonding package. In general, any conventional application technique may be used to apply molding interface material 404 on low-K Si die 402. For example, it may include brushing or spraying, or dipping low-K Si die 402 into a thin film of molding interface material 404, thereby coating the low-K Si die surface(s).

Alternatively, the application of molding interface material can be done after low-K Si die is mounted into its corresponding wire bonding package. Preferably, the application is done after attaching low-K Si die onto the wire bonding packaging substrate (e.g., 114; 121; 214) and before wire bonding of interconnects is performed. FIG. 4B illustrates such a post-mounted low-K Si die 410 with an application of molding interface material 404 to side surfaces 406. As shown, molding interface material 404 may also be applied to an adjacent surface, such as die attach pad 412 of lead frame substrate 418. As a result, particularly where compressive forces are generated by molding interface material 404 (e.g., PI), a secure attachment of low-K Si die 402 to lead frame substrate 418 can be maximized. In addition, the side surfaces as well as the overall low-K Si die 402 are protected against package stresses, especially if there are microscopic cracks present along the edge/corner regions of the side surfaces.

FIG. 5 illustrates a general application of molding interface material to a low-K Si die lead frame type wire bonding package 500 according to various embodiments of the present invention. Since some molding compounds have a high CTE relative to that of low-K Si die 502, a coat of molding interface material 516 can be generally applied over low-K Si die 502 to create a stress buffering layer (e.g., stress buffer zone; stress barrier) there-between so that stress from the molding compound does not fall directly onto low-K Si die 502. The general application of molding interface material 516 may be done to any portion up to all exposed surfaces of low-K Si die 502. As before, application of molding interface material 516 may be performed when low-K Si die 502 is pre-mounted or post-mounted. In a preferred embodiment, molding interface material 516 exhibits a low CTE in the range between 5 ppm and 40 ppm and/or a low modulus of about 10 MPa or lower. For example, product R1004 (available from Nagase ChemteX Corporation, Osaka, Japan) or product R1001 (available from Ciba Specialty Chemicals Corporation, Basel, Switzerland) may be used. Moreover, it is possible to apply various coats of molding interface material 516 onto low-K Si die 502. For example, a low CTE and low modulus molding interface material 516 can be applied over an underlying coat of PI. Finally, molding interface material 516 may either be applied over or around (e.g., opening 511) interconnects 510 and/or bond pads on low-K Si die 502.

Figure 6:
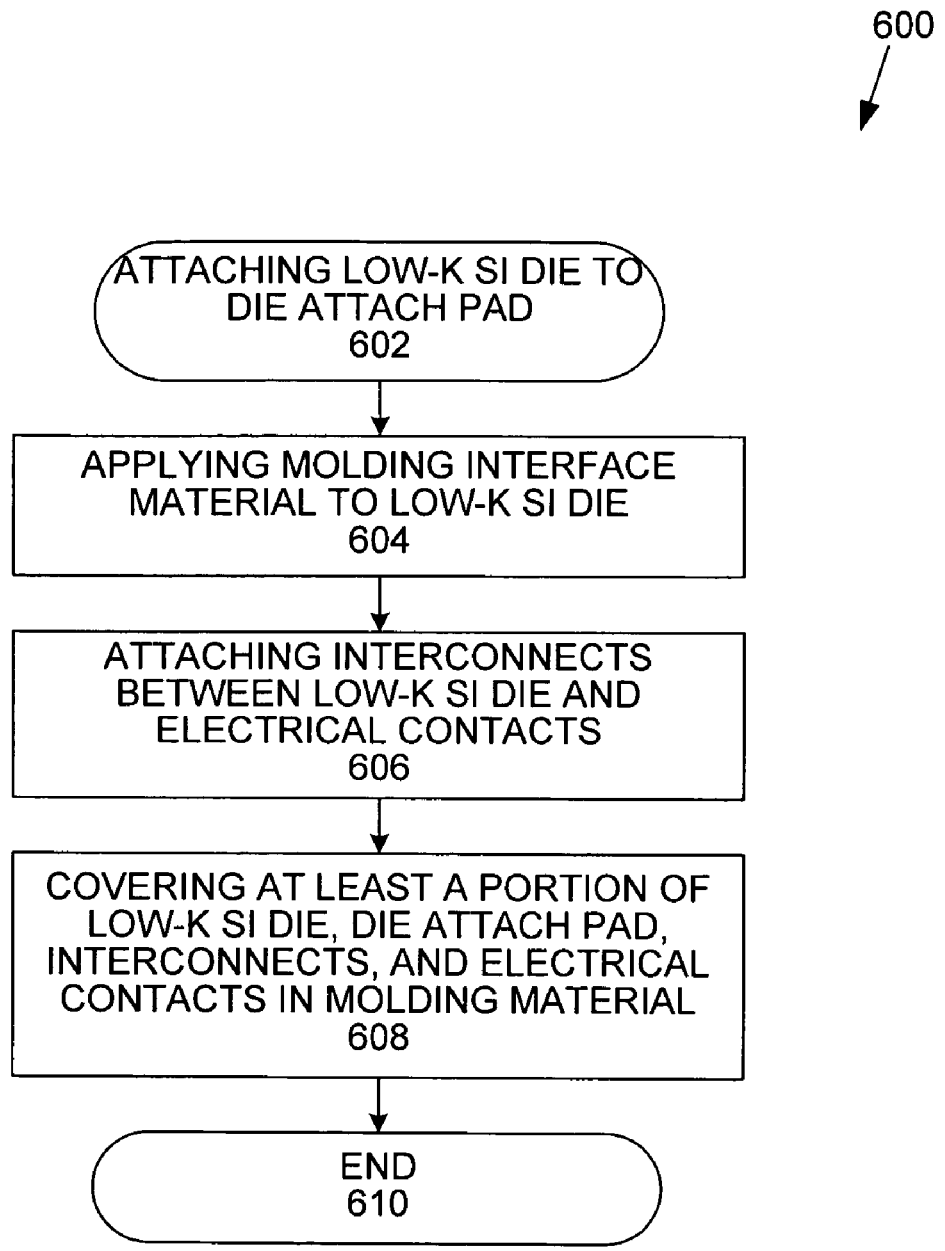
FIG. 6 illustrates a flow diagram of forming a low-K Si die wire bonding package with an application of molding interface material according to various embodiments of the present invention.

The packages described in the present invention may be constructed using any number of methods. For example, FIG. 6 illustrates a flow diagram 600 of forming a low-K Si die wire bonding package with an application of molding interface material (e.g., 216; 404; 516) according to various embodiments of the present invention. Beginning at operation 602, the attaching of a low-K Si die to a die attach pad is performed. Any wire bonding packaging substrate (e.g., 114; 121; 214; 418) can be used for this purpose. Next, applying molding interface material to the low-K Si die can be performed in operation 604. Selective application of the molding interface material will ensure proper reduction of package stress experienced by the low-K Si die. Further, in operation 606, attaching interconnects between the low-K Si die and the corresponding electrical contacts is performed. Thereafter, in operation 608, covering with molding material at least a portion of the low-K Si die, die attach pad, interconnects, and electrical contacts is performed. It will be appreciated by persons of ordinary skill in the art that some of the process operations may be reordered, repeated, or eliminated. For example, operations 602 and 604 may be reordered with each other. In this way, applying molding interface material to low-K Si die per operation 604 may be performed at a wafer level before singulating (e.g., sawing) out the low-K Si die for attachment to the die attach pad per operation 602. That is, applying molding interface material to the front surface of the wafer that corresponds to the top surface of the low-K Si die. Then sawing the wafer to form the low-K Si die for attachment to the die attach pad. Any conventional semiconductor wafer processing technique may be used for providing an individual low-K Si die. Thereafter, operation 604 can be repeated for applying molding interface material to low-K Si die after operation 602. This would be advantageous for applying molding interface material to the sides surfaces of the low-K Si die (e.g., 404 as shown in FIGS. 4A and 4B). In another example, operations 604 and 606 may be reordered with one another. Finally, process flow 600 ends at operation 610. As such, the present invention allows sufficient flexibility and support to counter the inherent package stresses of the CTE mismatch without causing any layer of the low-K materials to delaminate or crack. Moreover, the low-K Si die and package reliabilities are thereby enhanced, particularly for large die sizes, and complies with (e.g., passes) industry reliability testing standards.

Reliability testing for such packages generally involves subjecting the packages to industry available and accepted reliability testing standards such as those established by the Electronic Industries Association (EIA) or the Joint Electron Device Engineering Council (JEDEC). For example, JESD22-A104 and Mil Std 1010. In one embodiment, industrial grade reliability testing is performed on the packages and includes cycling the temperature between −55° C. to 125° C. and/or running 1000 cycles. Temperature cycling is conducted to determine the resistance of the low-K Si die to high and low temperature extremes. This environmental stress test is designed to simulate the extensive changes in temperature to which the low-K Si die and the package may be exposed. Typically, to pass the test, the low-K Si die and/or layers of low-K material should not show signs of damage such as cracking, chipping, delamination, or breaking.

CONCLUSION

The foregoing invention presents many advantages over conventional low-K Si die wire bonding packages. For example, the present invention provides a highly reliable wire bonding package solution for low-K and future extra low-K Si dice. In addition, molding interface material (e.g., PI) can be used in low-K Si die wire bonding packages to provide for a larger process window.

Although the foregoing invention has been described in some detail for purposes of clarity of understanding, it will be apparent that certain changes and modifications may be practiced within the scope of the appended claims. For example, as will be appreciated by persons in the art, the present invention is applicable to different types of wire bonding packages that incorporate a low-K Si die. The wire bonding packages may include any type, including, but not limited to: lead frame type and ball grid array type. Therefore, the present embodiments are to be considered as illustrative and not restrictive, and the invention is not to be limited to the details given herein, but may be modified within the scope and equivalents of the appended claims.

What is claimed is:

1. A semiconductor package comprising:
   a die having a plurality of layers of low-K dielectric material in the die, the die having a top surface including circuitry fabricated thereon, a non-active surface not including circuitry, and a plurality of side surfaces, each surface having associated corner and edge regions;
   a wire bonding packaging substrate having a plurality of electrical contacts, the packaging substrate being positioned under the die;
   a plurality of interconnects electrically connecting the die to the plurality of electrical contacts;
   a molding interface material applied to at least a portion of the top surface of the die, the molding interface material being configured to control at least one of tensile and shear stresses experienced by the die in the proximity of the active surface; and
   a molding cap including a molding compound covering at least a portion of the die, packaging substrate, interconnects, and the molding interface material;
   wherein the molding interface material is a discrete layer separate from the molding compound and formed between the molding cap and the die.

2. A semiconductor package as recited in claim 1, wherein the molding interface material is configured to introduce compressive stress to the die and strengthen the die against the at least one of tensile and shear stresses.

3. A semiconductor package as recited in claim 1, wherein the molding interface material is either polyimide or BCB.

4. A semiconductor package as recited in claim 1, wherein the molding interface material is on at least a portion other plurality of side surfaces of the die.

5. A semiconductor package as recited in claim 4, wherein the molding interface material is also on a corresponding adjacent portion of the packaging substrate in order to secure the die to the packaging substrate.

6. A semiconductor package as recited in claim 1, wherein the molding interface material is applied in multiple non-contiguous regions to the top surface of the die.

7. A semiconductor package as recited in claim 6, wherein at least one of the multiple non-contiguous regions is rectangular in shape.

8. A semiconductor package as recited in claim 6, wherein at least one of the multiple non-contiguous regions is triangular in shape.

9. A semiconductor package as recited in claim 6, wherein each of the multiple non-contiguous regions has a thickness of less than 2 microns.

10. A semiconductor package as recited in claim 1, wherein the molding interface material is a contiguous region on the top surface of the die excluding corner regions.

11. A semiconductor package as recited in claim 10, wherein the contiguous region is offset front the corner regions by about 100 to 150 microns.

12. A semiconductor package as recited in claim 10, wherein the molding interface material is a contiguous region on the top surface of the die excluding edge regions.

13. A semiconductor package as recited in claim 12, wherein the contiguous region is offset from the edge regions by about 100 to 150 microns.

14. A semiconductor package as recited in claim 1, wherein the molding interface material has a coefficient of thermal expansion between 5 ppm and 40 ppm.

15. A semiconductor package as recited in claim 14, wherein the molding interface material is over a substantial portion of the top surface of the die such that a stress buffer zone is established between the top surface of the die and the molding cap.

16. A semiconductor package as recited in claim 1, wherein the plurality of layers includes extra low-K dielectric material.

17. A semiconductor package a recited in claim 1, wherein the molding interface material is a layer positioned between and in contact with the die and the molding cap.

18. A semiconductor package as recited in claim 1, wherein the plurality of layers of low-K dielectric material have a CTE between the range of 20 ppm and 50 ppm.

19. A semiconductor package as recited in claim 1, wherein the plurality of layers of low-K dielectric material have a dielectric constant between 2.6 and 3.5.

20. A semiconductor package as recited in claim 1, wherein the plurality of layers of low-K dielectric material have a dielectric constant between 2-2 and 2.6.

* * * * *

UNITED STATES PATENT AND TRADEMARK OFFICE
CERTIFICATE OF CORRECTION

PATENT NO.         : 7,427,813 B1                                   Page 1 of 1
APPLICATION NO. : 10/719218
DATED              : September 23, 2008
INVENTOR(S)       : Wang et al.

It is certified that error appears in the above-identified patent and that said Letters Patent is hereby corrected as shown below:

CLAIMS:

1. In line 16 of claim 1 (column 11, line 33) change "active" to --top--.

2. In line 2, of claim 4 (column 11, line 47) change "other" to --of the--.

3. In line 2 of claim 11 (column 12, line 19) change "front" to --from--.

Signed and Sealed this

Sixteenth Day of December, 2008

JON W. DUDAS
*Director of the United States Patent and Trademark Office*